United States Patent [19]

Heide et al.

[11] Patent Number: 5,045,525

[45] Date of Patent: Sep. 3, 1991

[54] METHOD FOR THE SYNTHESIS OF A HIGH-TEMPERATURE SUPERCONDUCTOR OF A DEFINED COMPOSITION

[75] Inventors: Helmut Heide, Kelkheim; Heinrich Winter, Eschborn; Eva Poeschel, Bad Soden; Eckhard Hinze, Pohlheim, all of Fed. Rep. of Germany

[73] Assignee: Battelle Institut E.V., Frankfurt, Fed. Rep. of Germany

[21] Appl. No.: 197,207

[22] Filed: May 23, 1988

[30] Foreign Application Priority Data

May 21, 1987 [DE] Fed. Rep. of Germany ....... 3717056
Aug. 17, 1987 [DE] Fed. Rep. of Germany ....... 3727381

[51] Int. Cl.$^5$ .............................................. B29C 43/02
[52] U.S. Cl. ......................................... 505/1; 264/56; 264/84; 264/125; 505/739
[58] Field of Search ................. 505/1, 815, 822, 739; 264/56, 60, 61, 84, 125, 66, 65

[56] References Cited

U.S. PATENT DOCUMENTS

| | | | |
|---|---|---|---|
| 3,081,498 | 3/1963 | Davis et al. | 264/84 |
| 3,752,665 | 8/1973 | Roy et al. | 264/84 |
| 4,717,627 | 1/1988 | Nellis et al. | 428/552 |
| 4,762,754 | 8/1988 | Nellis et al. | 428/552 |
| 4,812,272 | 3/1989 | Heinrich et al. | 264/65 |

FOREIGN PATENT DOCUMENTS 62-252014 11/1987 Japan ................................. 505/823

OTHER PUBLICATIONS

Sadananda, "Effect of Hot Isostatic Pressing on $RBa_2Cu_3O_7$ Superconductors", Adv. Ceramic Mat'l, 3(5), 524–26, 1988.

Tien, "Hot Isostatic Pressing (HIP) for the Densification of Oxide Superconductors", High-Temperature Superconductors II, Apr. 5–9, 1988.

Patel, "Electrical, Mechanical and Ultrasonic Properties of a Sintering Aid Modified $YBa_2Cu_3O_x$ High $T_c$ Superconductor", Adv. Ceramic Mat'l, 2(3B), 1987.

*Primary Examiner*—Mary Lynn Theisen
*Attorney, Agent, or Firm*—Spensley Horn Jubas & Lubitz

[57] ABSTRACT

A method for the synthesis of an oxide high-temperature superconductor of defined composition by sintering of the starting oxides, wherein sintering is effected in a chemically and phyically closed system by generating a preset oxygen partial pressure through the use of peroxide additives, and the oxidic starting mixture is chemically shielded against the container material and stabilized thermodynamically.

7 Claims, 3 Drawing Sheets

METHOD FOR THE SYNTHESIS OF A HIGH-TEMPERATURE SUPERCONDUCTOR OF A DEFINED COMPOSITION

BACKGROUND OF THE INVENTION

This invention relates to a method for the synthesis of oxidic high-temperature superconductors of defined composition having the general formula SE-EA-Cu-O, wherein SE represents a rare earth metal and EA represents an alkaline earth metal, and especially those with a perovskite structure, by sintering of the starting oxides.

Since reports of the spectacular results of the IBM team of Bednorz and Mueller regarding a significant increase in the transition temperature of oxidic superconductors, intensive research activities relating to these materials have been taken up all over the world (Bednorz, J. G. and Mueller, K. A., "Possible High $T_C$ to Superconductivity in the Ba-La-Cu-O System. Condensed Matter," Zeitschr. f. Physik 64, 189–193 (1986)). Further progress in this field has been reported through late 1986 and early 1987. The principal focus of this work has been on compounds of the general formula:

$$SE_1\ EA_2\ Cu_3\ O_{7-x},\ X \leq 0.5$$

wherein SE represents a rare earth metal and EA represents an alkaline earth metal. Oxidic superconductors comprise compounds of this phase system having a perovskite structure. Of particular interest are compounds within the systems La-Ba-Cu-O and Y-Ba-Cu-O.

The superconductivity of such materials and their high transition temperatures, which according to Politis et al. (Wu, M. K. et al., "Superconductivity at 93K in New Mixed Y-Ba-Cu-O Compound System at Ambient Pressure," Physical Review Letters 58, 908–910 (1987)) may well reach 0° C., depend on the formation of specific perovskites with non-stoichometric (astoichiometric) oxygen contents. Moreover, superconductivity and transition temperature appear to depend, in a manner which is not yet quite clear, on the occurrence of $Cu^{3+}$–$Cu^{2+}$ charge states within the perovskite lattice.

In the past, such compounds have been prepared by sintering specific homogeneous oxide mixtures at relatively high sintering temperatures, following a cold pre-pressing at elevated pressure. It has been observed that the corresponding phases, depending on the experimental conditions, are formed only to a limited extent. The quality of the product, especially as reflected by the transition temperature $T_C$, will depend significantly on the experimental conditions.

At this time, several problems are presented with respect to preparation of such superconductors on an industrial scale. Given the present state of the art, the complex chemical structure of the product with its defined deviation from stoichiometry is difficult to cope with from a technological point of view; for example, the sintering temperatures necessary for structural compacting have a system-specific effect on both the oxygen contents and the valence states and coordination relationships of the perovskite structure. Further, the superconductive oxides of interest present major problems with respect to preparing products of a desired shape, on account of their brittleness. Thus, in addition to the work necessary for solution of fundamental problems of theory, research activities must be directed to the reduction of these scientific findings to technological practice. Techniques proposed to date for the solution of these problems do not appear suitable for the development of complex superconductive materials having the necessary quality and stability, nor do the available techniques appear economically feasible for industrial-scale production.

A survey of the literature confirms current understanding that the physical phenomena of superconductivity at present still appear to depend on as yet not fully controllable textural and structural properties of a material. In particular, depending on the concentration and distribution of secondary phases which accumulate at the grain boundaries of polycrystalline materials, the overall properties of the product may be dramatically affected; these "detrimental" grain boundary segregations may not, however, necessarily be involved in the overall mechanism. In addition, structural density seems to influence the quality of the superconductor, especially the stability of the product and permissible current densities in the use thereof.

SUMMARY OF THE INVENTION

It is an object of this invention to provide a method which permits the synthesis of oxidic high-temperature superconductors of defined composition.

It is a further object of this invention to provide a method for synthesis of oxidic high-temperature superconductors which may be adapted for industrial production.

According to the present invention, these and other objects are achieved by a process wherein sintering is effected by enclosing the starting oxides in a gas-tight container in a chemically and physically closed system. At least one thermally decomposable alkaline earth metal peroxide is added to the oxidic starting mixture for the adjustment of oxygen partial pressure. The oxidic starting mixture is covered with a protective layer whose composition corresponds to that of individual coexisting phases of the superconductor for chemical shielding against the container material and for thermodynamic stabilization of the desired superconductor phase.

The synthesis of the superconductive materials takes place in chemically and physically closed systems. This synthesis is preferably carried out under pressure, either employing a hot isostatic pressure method (HIP) or explosive compacting.

The oxygen partial pressure required in the closed system is adjusted by addition of defined quantities of unstable metal peroxides which split off oxygen when heated and which are preferably from the same phase equilibrium from which the superconductor has been developed. In the present case this may, for example, be barium peroxide ($BaO_2$). The peroxide is used in a quantity as is necessary for the adjustment of the corresponding $O_2$ partial pressure, in addition to the barium oxide (BaO) which is normally used for preparation of the superconductor material.

To generate a closed system, the reaction chamber is enclosed in a gas-tight container (e.g., a metal or glass can). According to the invention, this technique (which is conventional practice in the HIP process and in explosive compacting) is carried out in order to effectuate formation of states of defined composition. In order to avoid undesired reactions with the container material, it is necessary to build up a multistage reaction barrier. In the present case this barrier system has a dual function: avoiding undesired reactions with the container wall, and avoiding undesired phase differentiation at the grain boundaries. According to the invention, reaction at the container wall may be prevented by a protective layer of an inert material, such as BN. However, of decisive importance is a further barrier material employed to form an envelope and comprising compounds which correlate with the actual superconductor in the quaternary phase system (La-Ba-Cu-O or Y-Ba-Cu-O).

Through the use of this "intrinsic system barrier," the superconductor material is embedded in a material of its own kind. Using this type of barrier, corresponding secondary phases are generally not formed at grain boundaries within the material itself, but rather outside the superconductor within the barrier, where they have no detrimental effect and can be removed at a later stage. In this way, the entire system is "buffered" and rendered less sensitive to inhomogeneities of the material.

The foregoing considerations for hot isostatic pressing in "buffered" systems apply in an analogous manner to explosive compacting. However, such explosive compacting processes take place at much higher pressures (in the Mbar range) and at higher temperatures over very short periods of time. Whereas an HIP process generally yields crystallized states of defined composition, moreover, the phases obtained by explosive compacting are often less well defined. On the other hand, explosive compacting following a cold isostatic pre-pressing offers the possibility of using rapidly solidified powders of the desired composition as the starting material.

The synthesis of dense structures by high-pressure sintering or HIP is well known in the art. In addition, explosive compacting of dense structures, especially in the case of ductile crystalline as well as amorphous materials, is already a method in general use. The problems of secondary phase accumulation at grain boundaries in the production of superconductors, however, cannot be overcome in principle by these methods alone. In the case of the oxidic superconductors discussed here, it has become apparent that it is very difficult to adjust the defined oxygen partial pressures needed to achieve the necessary deviation from the standard stoichiometric ratios (astoichiometry) at elevated temperatures which is of paramount importance.

Sintering in closed systems under high gas pressure (HIP) not only has the advantage that dense and pore-free structures are obtained, but also offers the possibility of maintaining the system in condensed state, wherein the formation of gas phases is suppressed and defined phases can develop as a result of reduction in the degrees of freedom of the system. In particular, it is possible to adjust the oxygen partial pressures to attain the necessary defined level in the gas-tight container by means of the HIP process through the addition of defined quantities of peroxides which split off oxygen. These peroxides are preferably selected to correspond to components of the specific phase system of the superconductor product (e.g., barium peroxide).

A further advantage of the HIP process resides in the fact that, in general, temperatures required for the synthesis of ternary compounds by the simultaneous application of elevated pressure and temperature may be much lower than if sintering were carried out under normal pressure.

BRIEF DESCRIPTION OF THE DRAWINGS

The invention may be better understood with reference to the accompanying drawings, in which.

DETAILED DESCRIPTION OF PREFERRED EMBODIMENT

Figure 1:
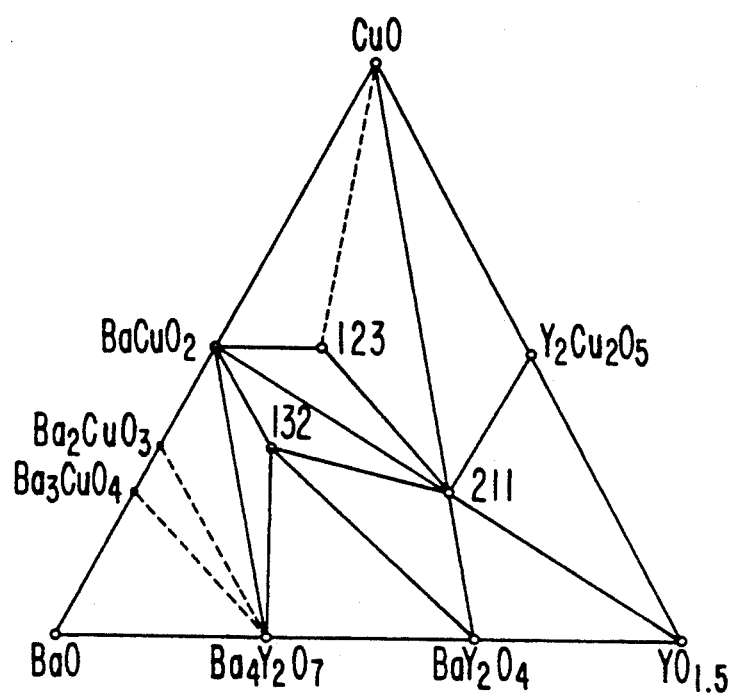
FIG. 1 shows the phase relationship in the ternary system $YO_{1.5}$-BaO-CuO.

With reference to FIG. 1, the phase relationship in a ternary system of particular interest is illustrated for the system $Y_2O_3$-BaO-CuO at 950° C. FIG. 1 is taken from an article by Frase, et al., entitled "Phase Compatibilities in the System $Y_2O_3$-BaO-$C_uO$ at 950° C.", which was submitted to the Communications of the American Ceramic Society on Apr. 7, 1987.

Figure 2:
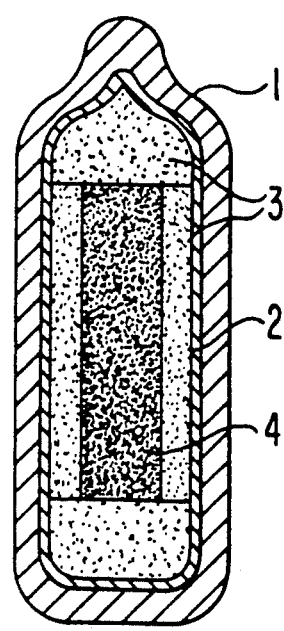
FIG. 2 shows a schematic section through a container for carrying out the method according to the invention.

FIG. 2 depicts a can 1 which comprises glass or metal. The inside of the container is lined in this embodiment with a first barrier 2 comprising a suitable inert material, for example boron nitride; while the inert barrier is advantageous in reducing reaction with the container, it is not strictly necessary to achieve the objects of the invention. Within the first barrier 2, there is a second barrier 3 serving as buffer. The second barrier 3 surrounds the superconductive starting material 4, preferably in the form of a powder. This material 4, for example, corresponds to point 123 in the ternary system illustrated in FIG. 1.

The cylindrical specimen of starting material 4 of the desired composition, for example 123, is embedded in this embodiment as a highly compacted powder pellet in the multi-layer barrier system which is intended to prevent undesired reactions of the specimen with the can material (glass or metal). For this purpose, hexagonal boron nitride or other inert material would be suitable.

Barrier 3 next to the specimen of starting material 4 comprises the specific phases coexisting with the desired phase, for example "123" in FIG. 1, as thermodynamic buffer of the system. Such coexisting phases will be generally identified with reference to the phase diagram of a particular system, such as $Y_1Ba_2Cu_3O_{7-x}$ as illustrated in FIG. 1.

The location at which coexisting secondary phases in the structure, which are observed when sintering is carried out at ambient pressure, are formed is shifted by this procedure so as to occur primarily in the marginal phases of the material. This marginal material, including the secondary phases, may then be removed by physical separation or other suitable means at a later stage.

Hence, it is obvious that by following the method described therein, one may obtain highly dense bulk materials for use as high-temperature superconductors of defined composition which can then be ground and used as intermediates for further processing, for example by powder metallurgical methods.

According to preferred embodiments of the invention, a superconductor can be formed from a starting oxide body which had been previously compacted, as by cold isostatic pressing (CIP), by subjecting the starting oxide body to hot isostatic pressing at elevated gas pressure from 500 to 4000 bar and temperatures between 300° C. and 1200° C.

EXAMPLES

Fabrication of $Y_1Ba_2Cu_3O_{7-x}$ by Sintering at Atmospheric Pressure $Y_2O_3$, $BaCO_3$ and CuO in stochiometric ratios for the formation of $Y_1Ba_2Cu_3O_{7-x}$ were comminuted and mixed by grinding in an agate mortar. Sintering of this mixture was effected in two steps. The first sintering stage was carried out in air at 950° C. for 12 h. Subsequently the mixture was ground again in the mortar and pressed into pellets of 12 mm diameter at a compacting pressure of 5000 kgf/cm². The second stage of sintering was performed with these pellets in flowing oxygen at a temperature of 950° C. which was maintained for 60 minutes, and at a cooling rate of 70° C./h. At the temperature of liquid nitrogen the meissner effect was observed on these pellets but the critical current density remained below 1000 A/cm². The microstructure of the pellets revealed voids and segregations. This represents the present state of the art.

Fabrication of $Y_1Ba_2Cu_3O_{7-x}$ by HIP Consolidation and Buffering in the Presence of the Coexisting Phases CuO, $BaCuO_2$ and 211

The starting materials BaO, CuO and $Y_2O_3$ were mixed in stochiometric ratio and synthesized in a two-stage sintering process.

Figure 3:
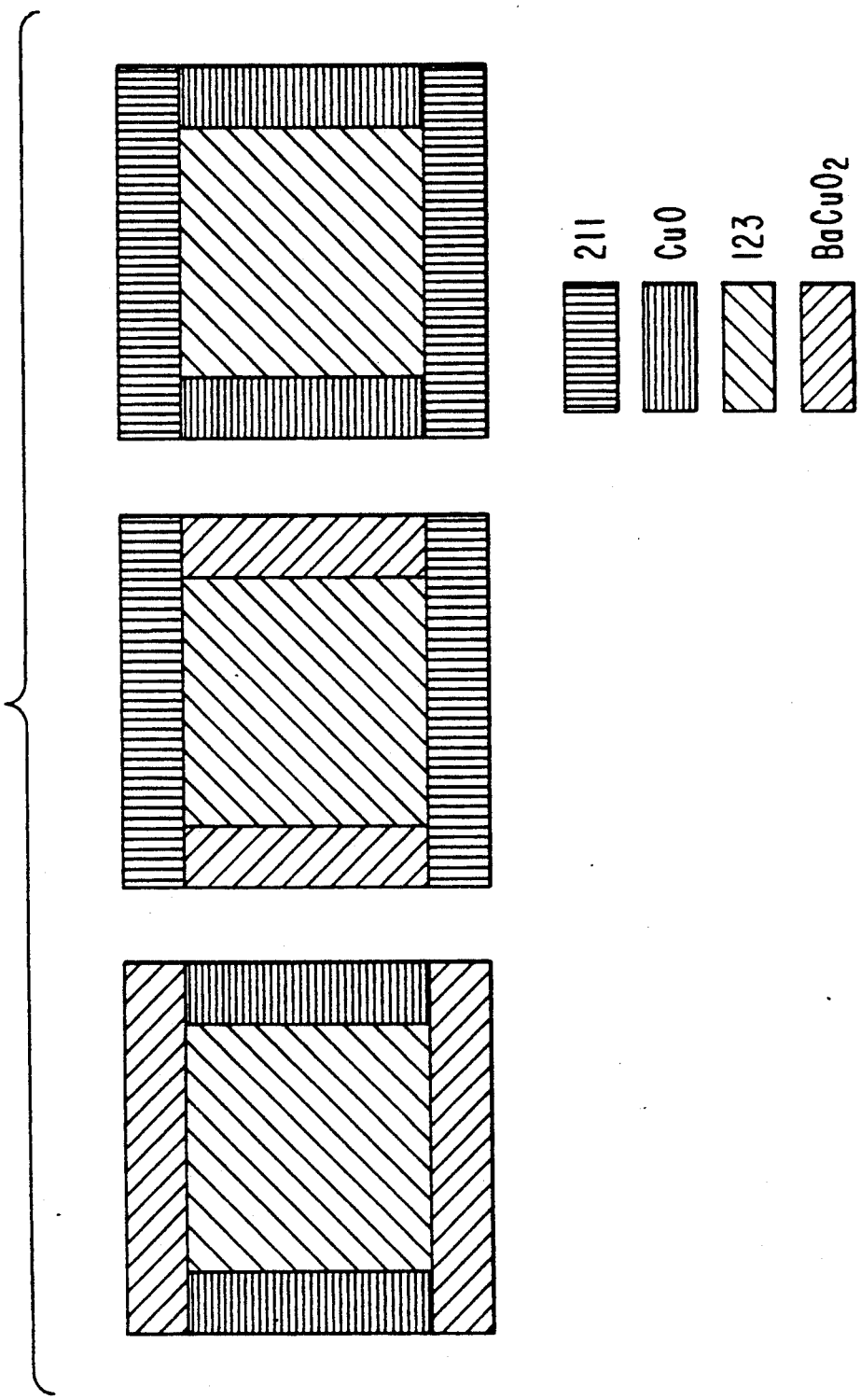
FIG. 3 shows a setup of coexisting phases to HIP-process.
Figure 4:
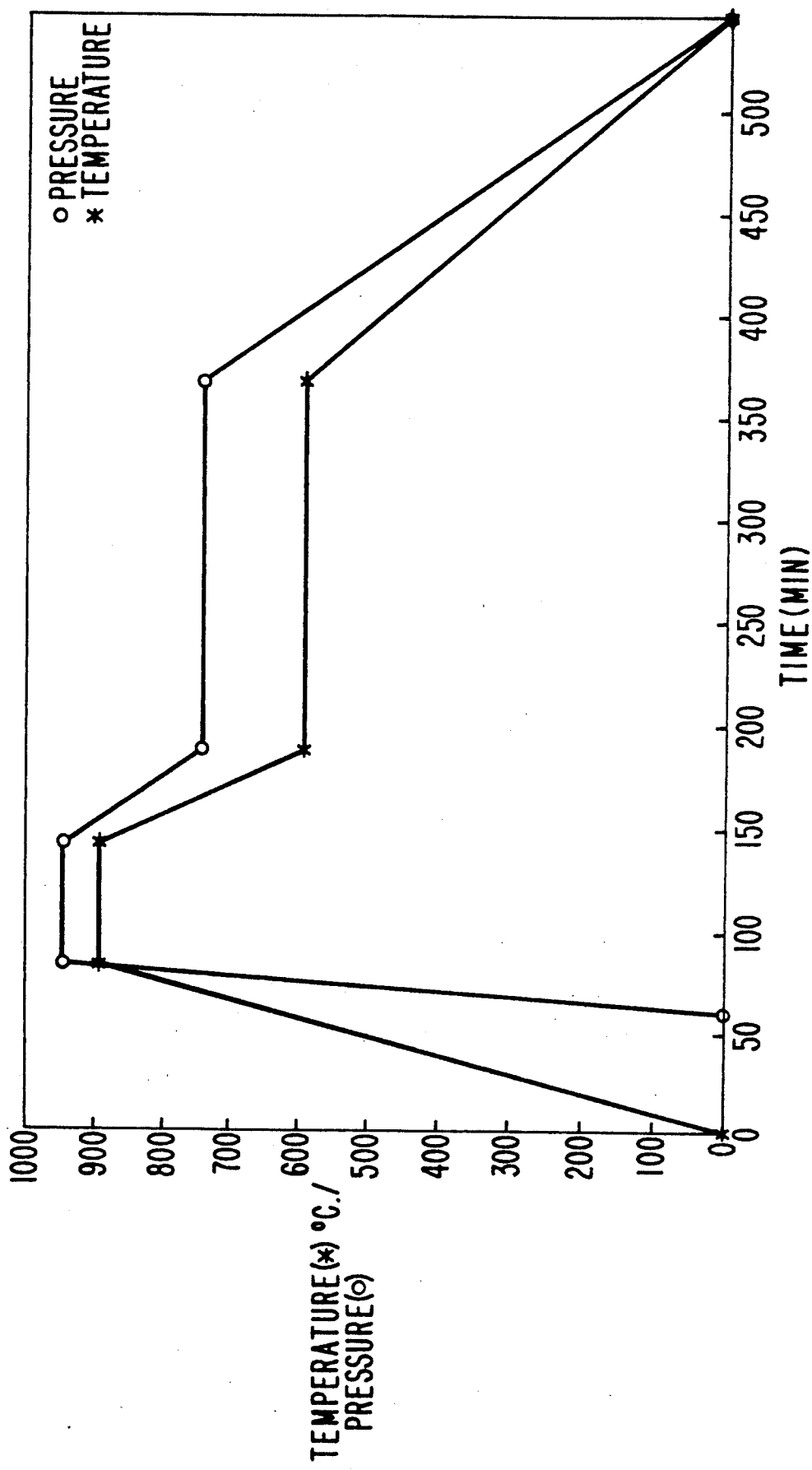
FIG. 4 is a diagram illustrating an exemplary pressure and temperature program for an HIP procedure according to the invention.

The first sintering stage was performed at a temperature of 600° C. which was maintained for 24 h in flowing oxygen. The second sintering stage was carried out after compacting of the synthesis products into pellets or cylinders at a temperature of 900° C., which was maintained for 6 h, with final slow cooling to 200° C. within a period of 24 h:

The pellets or cylinders which has thus been produced were subsequently machined so that it was possible to realize a setup for the HIP process according to FIGS. 2 and 3. FIG. 3 schematically represents the three possible configurations of the coexisting phases CuO, $BaCuO_2$ and 211 with additions of 5% of $BaO_2$ (see FIG. 1) around the $Y_1Ba_2Cu_3O_{7-x}$ cylinder. The combination of the cylinder and the surrounding coexisting phases with additions of $BaO_2$ preferably is cold isostatically pressed and placed in a shell of Boron-Nitride as outlined in FIG. 2 and finally sealed in a glass capsule (Duran-glass) under vacuum as can be seen in FIG. 2. For the final consolidation by hot isostatic pressing the following HIP-regime was applied as shown in FIG. 4. The heating time until the onset of pressure at 950° C. was 80 min. After this temperature had been maintained for 1 h, the samples were cooled within 40 min to 600° C., and this temperature was maintained for 3 h. The cooling process to room temperature took another 3.5 h.

After removing the glass container and the Boron-nitride shell 2 as well as the buffering layers 3 according to FIG. 2 a dense cylinder of single phase the superconducting $Y_1Ba_2Cu_3O_{7-x}$ phase with x=0.3 resulted with superiour superconducting properties. The critical current density $I_{max}$ was measured to $5 \times 10^4 A/cm^2$ at the temperature of liquid nitrogen.

Although particular embodiments of the invention have been shown and described, it will occur to those with ordinary skill in the art that other modifications and embodiments exist as will fall within the true spirit and scope of the invention as set forth in the appended claims.

What is claimed is:

1. A method of producing a substantially stoichiometric, oxidic high-temperature superconductor body from a starting mixture of the general composition $SE_1EA_2Cu_3O_{7-x}$, where SE is a rare earth metal or yttrium and EA is an alkaline earth metal, comprising:

adding thermally decomposable barium peroxide to the starting mixture to establish a predetermined oxygen partial pressure in the starting mixture;

covering the starting mixture containing the barium peroxide with a protective layer whose composition corresponds to that of the respective coexisting phases of the mixture in order to thermodynamically stabilize the desired superconductor phase;

enclosing the starting mixture, covered with the protective layer, in a gas-tight container forming a chemically and physically closed system, the protective layer being selected to chemically shield the starting mixture against reaction with the material of the container; and sintering the starting mixture at elevated pressure while the starting mixture, covered with the protective layer, is enclosed in the container.

2. A method according to claim 1, wherein said protective layer is surrounded by a second layer of inert material to further chemically shield the superconductor and protective layer against reaction with the material of the container.

3. A method according to claim 2, wherein said inert material is boron nitride.

4. A method as defined in claim 1 wherein the starting mixture comprises $Y_1Ba_2Cu_3O_{7-x}$ of perovskite structure.

5. A method as defined in claim 1 further comprising, after said step of covering and before said step of enclosing, compacting the covered starting mixture by performing cold isostatic pressing, and wherein said step of sintering includes a high-pressure synthesis at gas pressures of 500 to 4000 bar and temperatures between 300° and 1200° C.

6. A method as defined in claim 5, wherein said step of sintering further comprises, after the high pressure synthesis, cooling the superconductor body under pressure.

7. A method as defined in claim 1 wherein said step of sintering includes a high pressure synthesis explosive compacting procedure carried out by embedding the starting mixture, covered with the protective layer and enclosed in the container, in an explosive and in a pressure-proof explosion chamber, and igniting the explosive.

* * * * *